(12) United States Patent
Fujii et al.

(10) Patent No.: US 7,494,358 B2
(45) Date of Patent: Feb. 24, 2009

(54) TOUCH PANEL

(75) Inventors: Shigeyuki Fujii, Osaka (JP); Akira Nakanishi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/046,565

(22) Filed: Mar. 12, 2008

(65) Prior Publication Data

US 2008/0227308 A1   Sep. 18, 2008

(30) Foreign Application Priority Data

Mar. 14, 2007   (JP) .............................. 2007-064748

(51) Int. Cl.
   *H01R 13/15*   (2006.01)
(52) U.S. Cl. ........................ 439/260; 349/58
(58) Field of Classification Search ................. 439/260, 439/447, 458; 349/58
   See application file for complete search history.

(56) References Cited

U.S. PATENT DOCUMENTS 5,479,285 A * 12/1995 Burke ........................... 349/58
6,969,264 B2   11/2005 Fujii et al.
7,292,289 B2 * 11/2007 Nagahama ................... 349/58

FOREIGN PATENT DOCUMENTS

JP   2005-11312   1/2005

* cited by examiner

*Primary Examiner*—Truc T Nguyen
(74) *Attorney, Agent, or Firm*—Wenderoth, Lind & Ponack, L.L.P.

(57) ABSTRACT

A touch panel includes an upper substrate, a lower substrate, and a wiring board. The upper substrate includes an upper conductive layer, a pair of upper electrodes, and upper electrode terminals. The lower substrate includes a lower conductive layer, a pair of lower electrodes extending orthogonal to the upper electrodes, and lower electrode terminals. The wiring board includes a substrate portion, L-shaped upper and cover sheets. The substrate portion has upper and lower wiring patterns on its top and bottom surfaces, respectively. The upper wiring patterns are connected to each of the upper electrode terminals, and the lower wiring patterns are connected to each of the lower electrode terminals. At least part of the top surface of the upper wiring patterns is covered with the upper cover sheet, and at least part of the bottom surface of the lower wiring patterns is covered with the lower cover sheet.

6 Claims, 4 Drawing Sheets

TOUCH PANEL

BACKGROUND OF THE INVENTION

1. Field of the Invention

The present invention relates to a touch panel for operating various electronic devices.

2. Background Art

In recent years, electronic devices including mobile phones and car navigation systems have been increasingly multifunctional and diversified. More and more such electronic devices with increased functionality and diversity have come to use a touch panel for switching the various functions. Through the light-transmissive touch panel disposed on the front surface of a display element such as liquid crystal, the user can touch it with a finger or a touch screen pen while monitoring the display of the display element disposed behind the touch panel. Such a touch panel is required to have excellent visibility and to provide reliable operation.

One example of the conventional touch panels is described as follows with reference to FIGS. 5 to 8. FIG. 5 is an exploded plan view of the conventional touch panel. FIG. 6 is a plan view of the wiring board of the touch panel. FIG. 7 is an exploded perspective view of the wiring board. FIG. 8 is a sectional view of the wiring board when seen from the direction of the arrow of line 8-8. In FIG. 8, the size in the thickness direction is enlarged for easy understanding.

Touch panel 100 includes upper substrate 101 and lower substrate 102, which are light-transmissive. Upper substrate 101 has upper conductive layer 103 on its bottom surface, and lower substrate 102 has lower conductive layer 104 on its top surface. Upper and lower conductive layers 103 and 104 are light-transmissive and made of indium tin oxide or the like. Touch panel 100 is connected to wiring board 150 and hence to the electronic circuit (not shown) of an electronic device via wiring board 150.

Lower conductive layer 104 is provided with a plurality of dot spacers (not shown) of insulating resin arranged at predetermined intervals on its top surface. A pair of upper electrodes 115A and 115B, which are made of silver or the like, extends on the left and right ends of upper conductive layer 103. Upper electrode terminals 105A and 105B are disposed at and connected to the ends of upper electrodes 115A and 115B, respectively, on the bottom of upper substrate 101. In a word, at an end along side 140 at which upper substrate 101 is connected to wiring board 150, upper electrode terminals 105A and 105B are disposed at the ends of upper electrodes 115A and 115B. Lower electrodes 116A and 116B extend on the top and bottom ends of lower conductive layer 104 in the direction orthogonal to upper electrodes 115A and 115B. Lower electrode terminals 106A and 106B are disposed at and connected to the ends of lower electrodes 116A and 116B, respectively, on the bottom of lower substrate 102. In a word, at an end along side 143 at which lower substrate 102 is connected to wiring board 150, electrode terminals 106A and 106B are formed. Consequently, upper electrode terminals 105A, 105B disposed on the bottom of upper substrate 101 and lower electrode terminals 106A, 106B disposed on the bottom of lower substrate 102 are aligned alternately as shown in FIG. 5.

Frame-like spacer 107 is provided at the outer periphery of either the bottom surface of upper substrate 101 or the top surface of lower substrate 102. Spacer 107 is provided on one or both sides thereof with an adhesive layer (not shown) in order to bond upper substrate 101 and lower substrate 102 together at their outer peripheries. Thus, spacer 107 allows upper conductive layer 103 and lower conductive layer 104 to be confronted with a predetermined spacing therebetween.

Wiring board 150 includes film-like substrate portion 108 formed of connection part 108A of a large width and wiring part 108B of a small width. In short, substrate portion 108 is divided into connection part 108A and wiring part 108B by dotted line 134. Connection part 108A is on the side, where wiring board 150 is connected to touch panel 100, for dotted line 134, and wiring part 108B having end 138 is on the side, where wiring board 150 is connected to the electronic circuit. Substrate portion 108 has upper wiring patterns 109A and 109B on its top surface and lower wiring patterns 110A and 110B on its bottom surface. Upper wiring patterns 109A, 109B and lower wiring patterns 110A, 110B are made of copper, silver, or the like.

Wiring board 150 further includes through-hole electrodes 110C and 110D, filled with silver or the like, for leading lower wiring patterns 110A and 110B to the top surface of wiring part 108B at the end 138 side. Thus, lower wiring patterns 110A and 110B are on the top surface together with upper wiring patterns 109A and 109B at the end 138 side. Consequently, upper wiring patterns 109A and 109B are arranged alternately with lower wiring patterns 110A and 110B on substrate portion 108.

Wiring board 150 further includes film-like upper cover sheet 111 and lower cover sheet 112. As shown in FIGS. 6 and 7, upper cover sheet 111 is slightly shorter than substrate portion 108 at both ends 136 and 138 so as to cover the top surface of substrate portion 108 except for the end area on the end 136 side and the end area on the end 138 side. Lower cover sheet 112 is slightly shorter than substrate portion 108 at end 138 so as to cover the bottom surface of substrate portion 108 except for the end area on the end 138 side.

In FIG. 5, the end area on the end 136 side indicates area 142 of a predetermined width from end 136 to dotted line 130. The end area on the end 138 side indicates area 144 of a predetermined width from end 138 to dotted line 132.

To make it easy to understand the structure, FIG. 5 does not show the individual shapes of upper and lower cover sheets 111 and 112, but shows how it would look if upper cover sheet 111 was transparent and lower cover sheet 112 could be seen through it. Upper electrodes 115A, 115B and upper electrode terminals 105A, 105B are shown in solid lines. FIG. 6, in which wiring board 150 is seen from above, does not show the part of upper wiring patterns 109A, 109B that is under upper cover sheet 111, and the part of lower wiring patterns 110A, 110B that is under substrate portion 108.

Area 142 of substrate portion 108 is sandwiched between upper substrate 101 and lower substrate 102. Upper wiring patterns 109A and 109B are bonded to upper electrode terminals 105A and 105B, and lower wiring patterns 110A and 110B are bonded to lower electrode terminals 106A and 106B using, for example, an anisotropic conductive adhesive (not shown) containing a synthetic resin and conductive particles dispersed thereinto. Touch panel 100 is formed as mentioned above.

Touch panel 100 is fixed on the front surface of a display element such as liquid crystal using an adhesive or the like, and then installed in the electronic device. At this moment, wiring board 150 is bent in order to be connected to the electronic circuit. Furthermore, upper wiring patterns 109A, 109B and lower wiring patterns 110A, 110B are electrically connected at end 138 to the electronic circuit by a connection connector, soldering, or other means.

In the above-described structure, the user touches the top surface of upper substrate 101 with a finger, a touch screen pen, or the like while monitoring the display of the display element disposed behind touch panel 100. This touching causes upper substrate 101 to bend and hence upper conductive layer 103 at the touched portion to come into contact with lower conductive layer 104.

On the other hand, the electronic circuit including a controller and a data processor (both not shown), applies a voltage sequentially to upper electrodes 115A, 115B and lower electrodes 116A, 116B via upper wiring patterns 109A, 109B and lower wiring patterns 110A, 110B of substrate portion 108. Thus, the voltage is sequentially applied to the left and right ends of upper conductive layer 103 and to the top and bottom ends of lower conductive layer 104 which are orthogonal to the left and right ends of upper conductive layer 103. When upper substrate 101 is pressed and then upper conductive layer 103 at the pressed portion comes into contact with lower conductive layer 104, a voltage change at the pressed portion is detected. Then, the electronic circuit including the controller and the data processor detects the pressed portion based on the voltage ratio of voltages changed before and after pressing. In this manner, touch panel 100 and the electronic circuit can switch between the various functions of the electronic device.

Wiring board 150 is formed as follows. Upper wiring patterns 109A and 109B are formed on the top surface of substrate portion 108, and lower wiring patterns 110A and 110B are formed on the bottom surface of substrate portion 108. Substrate portion 108 has a thickness of 20 to 30 μm, and upper wiring patterns 109A, 109B and lower wiring patterns 110A, 110B have a thickness of 10 to 15 μm. Then, upper cover sheet 111 and lower cover sheet 112 are applied to cover the top surface and bottom surface, respectively, of substrate portion 108.

Upper wiring pattern 109A, lower wiring pattern 110A, upper wiring pattern 109B, and lower wiring pattern 110B are arranged in this order at larger intervals at the end area on the end 136 side than at the end area on the end 138 side which is connected to the connector and the like. This means that these wiring patterns are larger in width in connection part 108A than in wiring part 108B. The reason for this is to ensure the connection between the wiring patterns and upper electrode terminals 105A, 105B, lower electrode terminals 106A, 106B using the anisotropic conductive adhesive or the like at end 136.

As described hereinbefore, substrate portion 108 has upper cover sheet 111 covering most of its top surface and lower cover sheet 112 covering most of its bottom surface. This causes connection part 108A to have large thickness and width, thereby making it hard to bend connection part 108A when substrate portion 108 is installed in the electronic device. In addition, after the installment, the elastic returning force of connection part 108A causes stress on the connection part between the wiring patterns and upper electrode terminals 105A, 105B, lower electrode terminals 106A, 106B at the top end of wiring board 150.

SUMMARY OF THE INVENTION

An object of the present invention is to provide a touch panel which is easy to handle and ensures reliable operation due to stable electric connection. The touch panel includes an upper substrate, a lower substrate, and a wiring board. The upper substrate is provided with an upper conductive layer, a pair of upper electrodes extending on the left and right ends of the upper conductive layer, and upper electrode terminals connected to the upper electrodes on its bottom surface. The lower substrate is provided with a lower conductive layer confronted with the upper conductive layer with a predetermined spacing therebetween, a pair of lower electrodes extending on the top and bottom ends of the lower conductive layer in the direction orthogonal to the upper electrodes, and lower electrode terminals connected to the lower electrodes on its top surface. The wiring board includes a substrate portion and L-shaped upper and lower cover sheets. The substrate portion has upper wiring patterns on its top surface and lower wiring patterns on its bottom surface. The upper wiring patterns are each connected to each of the upper electrode terminals, and the lower wiring patterns are each connected to each of the lower electrode terminals. The upper cover sheet covers the top surface of the substrate portion, and the lower cover sheet covers the bottom surface of the substrate portion. The upper electrode terminals are on one side of the upper substrate. The lower electrode terminals are on the side of the lower substrate that is confronted with the side of the upper substrate. When the touch panel is seen from the front, the upper electrode terminals are adjacent to each other and the lower electrode terminals are adjacent to each other, these terminals being aligned in line. At least part of the top surface of the upper wiring patterns is covered with the upper cover sheet, and at least part of the bottom surface of the lower wiring patterns is covered with the lower cover sheet.

DETAILED DESCRIPTION OF THE INVENTION

Figure 1:
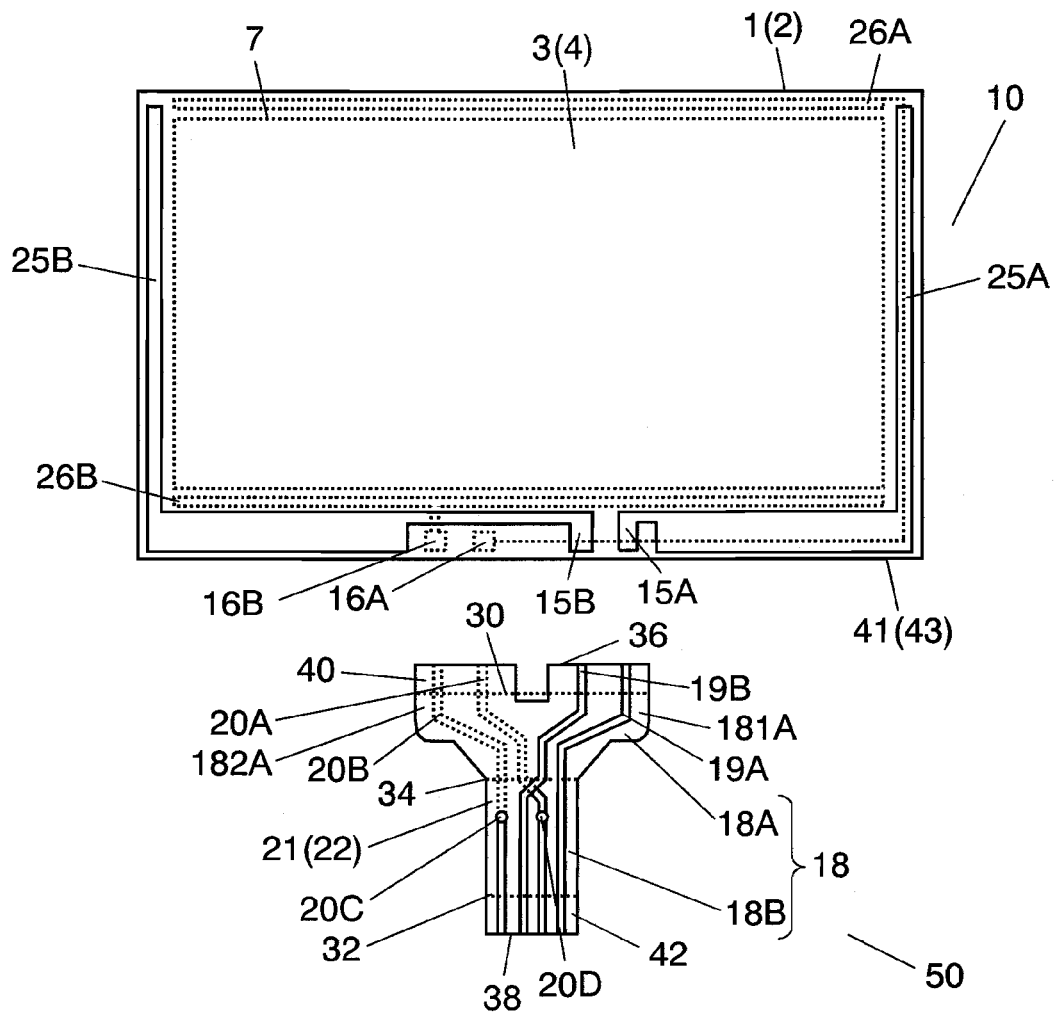
FIG. 1 is an exploded plan view of a touch panel according to an embodiment of the present invention.
Figure 2:
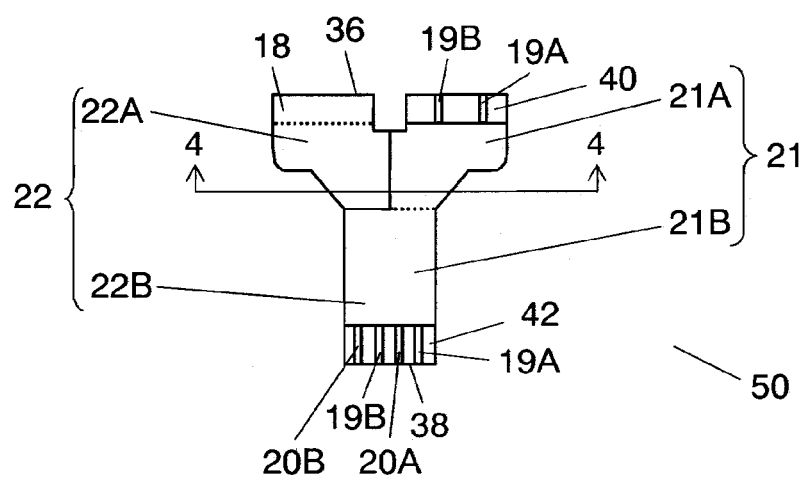
FIG. 2 is a plan view of a wiring board of the touch panel of FIG. 1.
Figure 3:
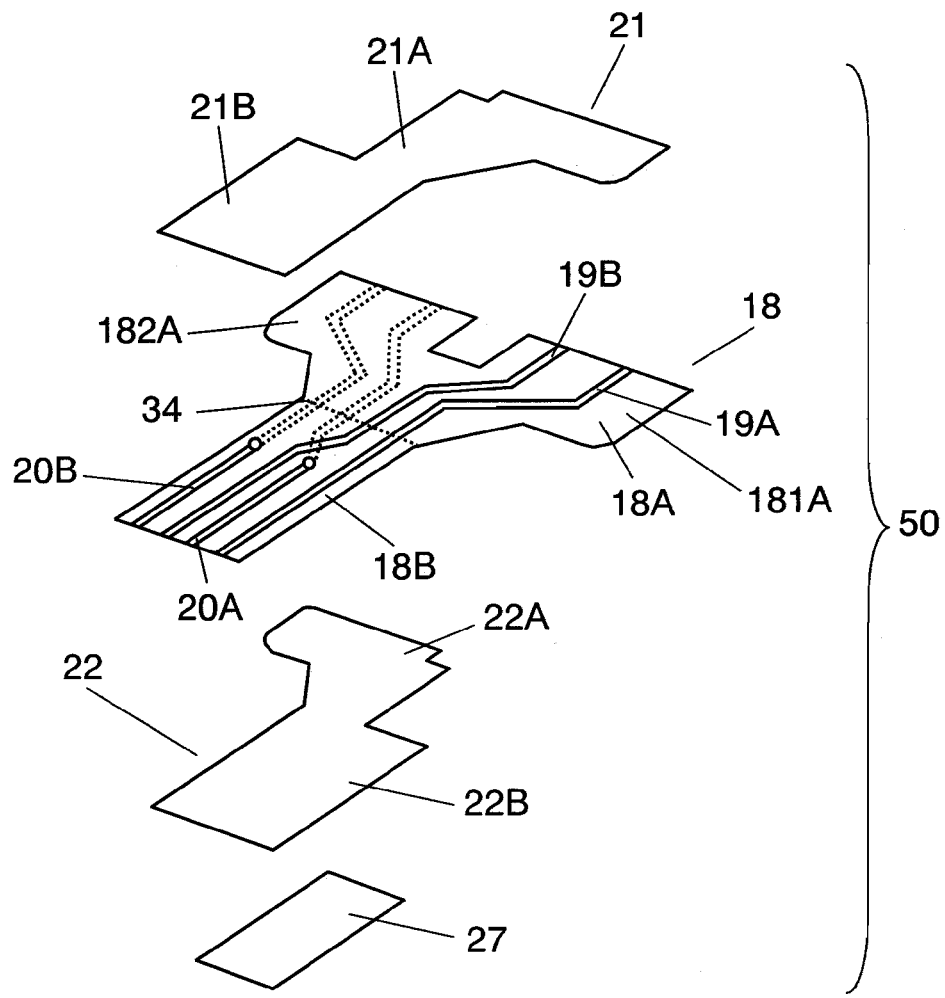
FIG. 3 is an exploded perspective view of the wiring board of FIG. 2.
Figure 4:
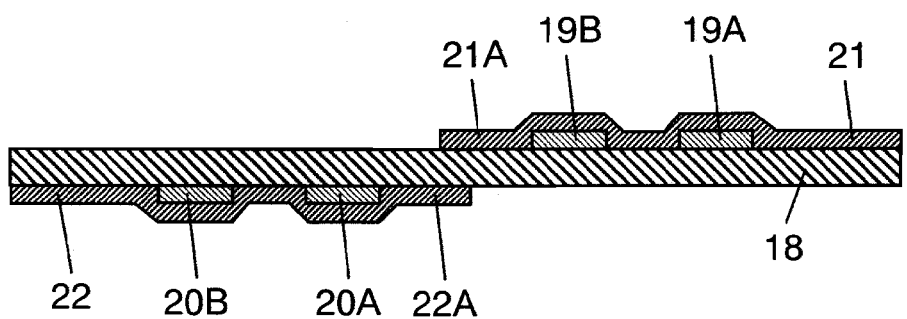
FIG. 4 is a sectional view of the wiring board of FIG. 2.
Figure 5:
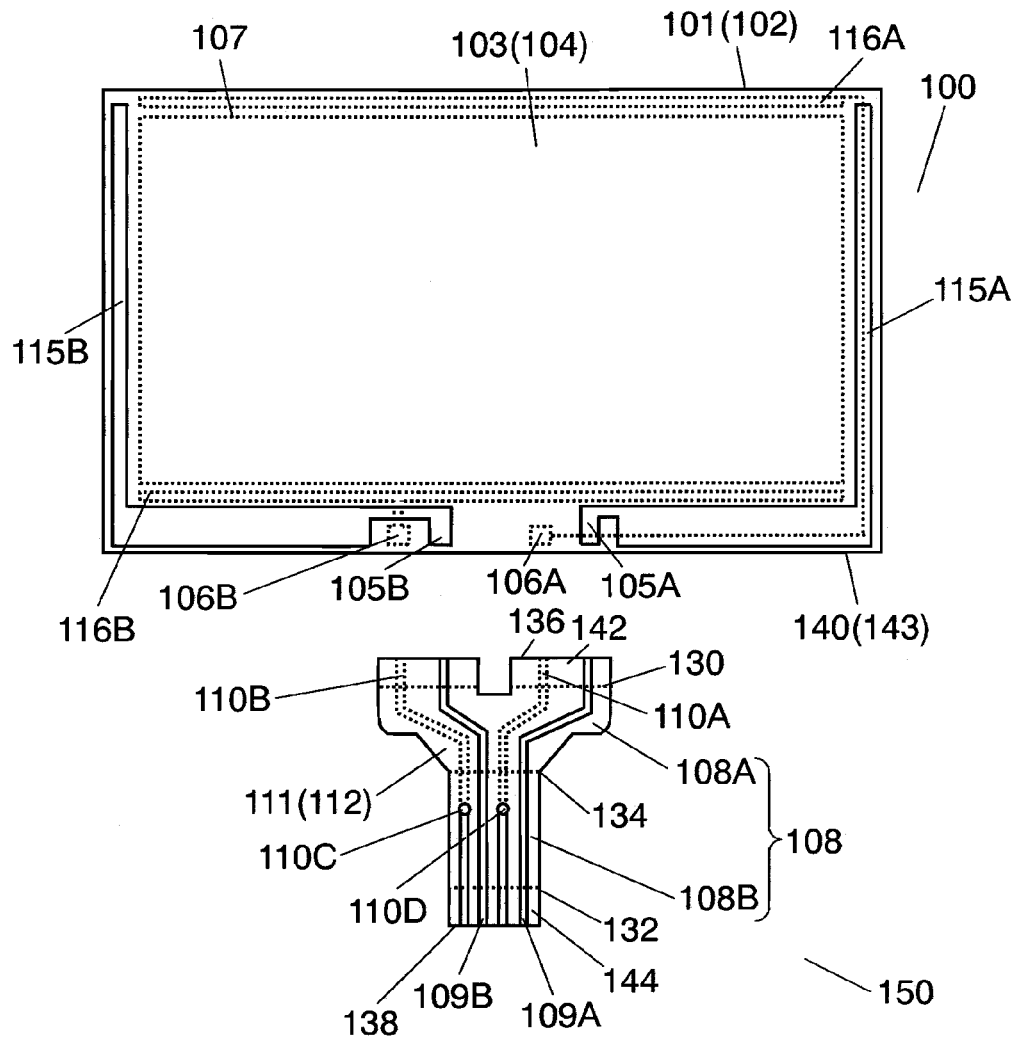
FIG. 5 is an exploded plan view of a conventional touch panel.
Figure 6:
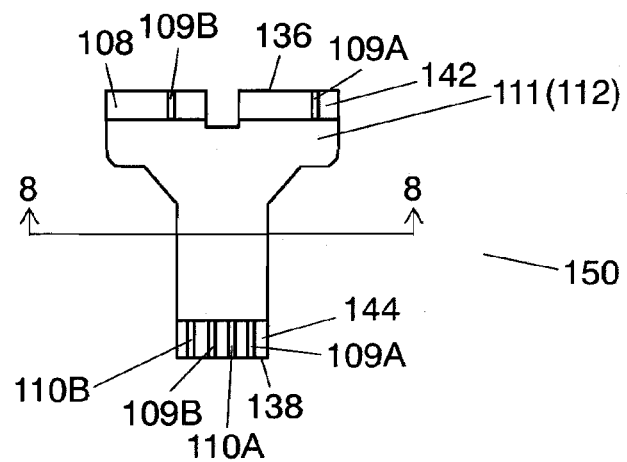
FIG. 6 is a plan view of the wiring board of the touch panel of FIG. 5.
Figure 7:
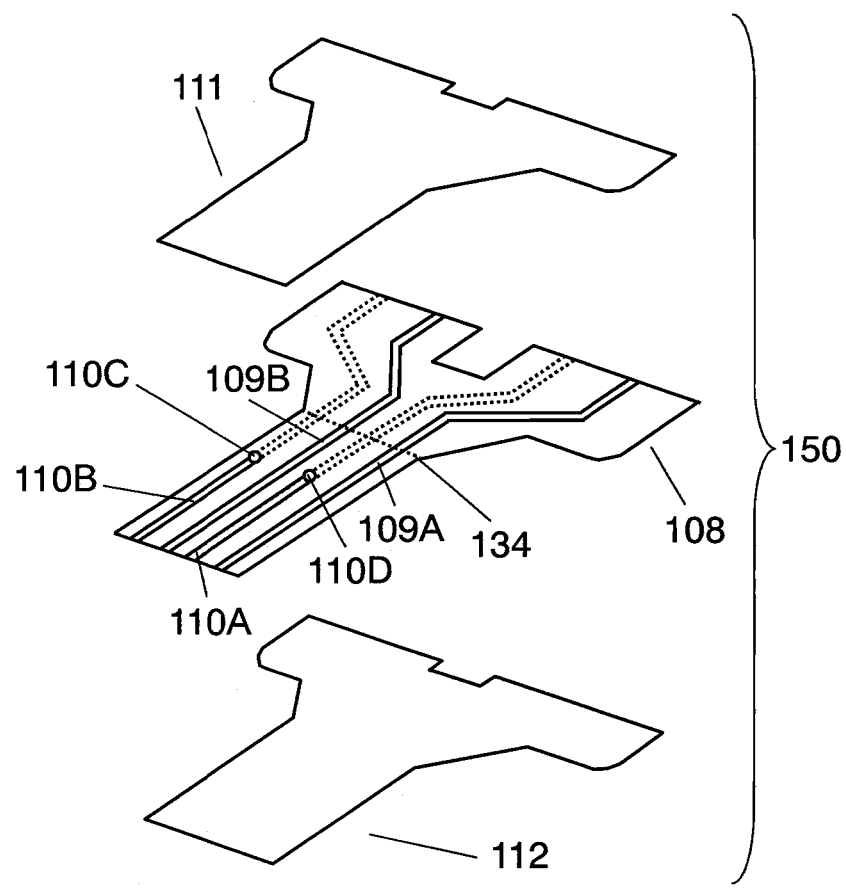
FIG. 7 is an exploded perspective view of the wiring board of FIG. 6.
Figure 8:
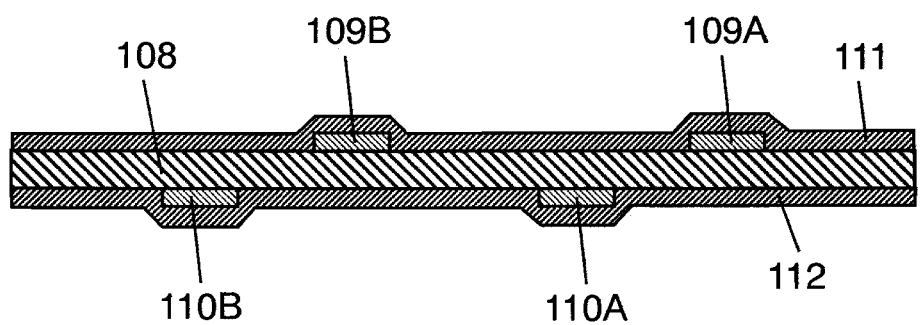
FIG. 8 is a sectional view of the wiring board of FIG. 6.

FIG. 1 is an exploded plan view of a touch panel according to an embodiment of the present invention. FIG. 2 is a plan view of a wiring board of the touch panel of FIG. 1. FIG. 3 is an exploded perspective view of the wiring board of FIG. 2 when seen from right above. FIG. 4 is a sectional view of the wiring board of FIG. 2 when seen from the direction of the arrow of line 4-4. In FIG. 4, the size in the thickness direction is enlarged for easy understanding.

The touch panel has body 10 including upper substrate 1 and lower substrate 2 which are light-transmissive. Upper substrate 1 is made of polyethylene terephthalate, polycarbonate, glass, or the like. Lower substrate 2 is made of glass, acrylic, polycarbonate, or the like. Upper substrate 1 has upper conductive layer 3 on its bottom surface, and lower substrate 2 has lower conductive layer 4 on its top surface. Upper and lower conductive layers 3 and 4 are light-transmissive and formed by sputtering indium tin oxide, tin oxide, or the like.

Lower conductive layer 4 is provided with a plurality of dot spacers (not shown) of insulating resin such as epoxy or silicon arranged at predetermined intervals on its top surface. Upper substrate 1 further has a pair of upper electrodes 25A and 25B made of silver, carbon, or the like. Upper electrodes 25A and 25B extend in the area of a width within a predetermined range from each of the left and right ends of upper conductive layer 3. The ends of upper electrodes 25A and 25B are led to the bottom of upper substrate 1. The bottom of upper substrate 1 is along side 41 at which upper substrate 1 is connected to wiring board 50. Upper substrate 1 further has upper electrode terminals 15A and 15B at the ends of upper electrodes 25A and 25B, respectively.

Lower substrate 2 further has lower electrodes 26A and 26B made of silver, carbon, or the like and extending orthogonal to upper electrodes 25A and 25B. More specifically, lower electrodes 26A and 26B extend in the area of a width within a predetermined range from the top and bottom ends of lower conductive layer 4 that are orthogonal to the left and right ends of upper conductive layer 3. The ends of lower electrodes 26A and 26B of lower substrate 2 are led to the bottom of lower substrate 2. The bottom of lower substrate 2 is side 43 at which lower substrate 2 is connected to wiring board 50. Lower substrate 2 further has lower electrode terminals 16A and 16B at the ends of lower electrodes 26A and 26B, respectively. Namely, upper electrodes 25A and 25B extend at the ends of upper conductive layer 3 in a first direction, and lower electrodes 26A and 26B extend at the ends of lower conductive layer 4 in a second direction perpendicular to the first direction.

As shown in FIG. 1, when upper substrate 1 is seen from the front, upper electrode terminals 15A and 15B are adjacent to each other and lower electrode terminals 16A and 16B are adjacent to each other. Upper electrode terminals 15A and 15B are aligned on the bottoms of upper substrate 1 in line, and lower electrode terminals 16A and 16B are aligned on the bottoms of lower substrate 2 in line.

Frame-like spacer 7 of polyester, epoxy, or the like is provided at the outer periphery of either the bottom surface of upper substrate 1 or the top surface of lower substrate 2. Spacer 7 is provided on one or both sides thereof with an adhesive (not shown) such as acrylic or rubber in order to bond upper substrate 1 and lower substrate 2 together at their outer peripheries. Thus, spacer 7 allows upper conductive layer 3 and lower conductive layer 4 to be confronted with a predetermined spacing therebetween.

Wiring board 50 connected to body 10 of the touch panel includes film-like substrate portion 18 formed of connection part 18A of a large width at the top and wiring part 18B of a small width at the bottom. Thus, substrate portion 18 is shaped like the letter T. In a word, substrate portion 18 is divided into connection part 18A and wiring part 18B by dotted line 34. Connection part 18A having end 36 is on the side at which wiring board 50 is connected to body 10, and wiring part 18B having end 38 is on the side at which wiring board 50 is connected to an electronic circuit (not shown). In short, connection part 18A corresponds to the horizontal line of the T, and wiring part 18B corresponds to the vertical line of the T. Substrate portion 18 is approximately 20 to 30 μm in thickness and made of polyimide, polyethylene terephthalate, or the like.

Substrate portion 18 has upper wiring patterns 19A and 19B on its top surface and lower wiring patterns 20A and 20B on its bottom surface. Upper wiring patterns 19A, 19B and lower wiring patterns 20A and 20B are 10 to 15 μm in thickness, made of copper, silver, carbon, or the like, and arranged substantially parallel to each other at both ends.

Wiring board 50 further includes through-hole electrodes 20C and 20D, filled with silver or the like, for leading lower wiring patterns 20A and 20B to the top surface of substrate portion 18 at the end 38 side. Thus, lower wiring patterns 20A and 20B are on the top surface together with upper wiring patterns 19A and 19B at the end 38 side. Consequently, upper wiring patterns 19A and 19B are arranged alternately with lower wiring patterns 20A and 20B on the end 38 side.

Wiring board 50 further includes film-like upper cover sheet 21 and lower cover sheet 22, which are 10 to 15 μm in thickness and made of polyimide, polyethylene terephthalate, or the like.

As shown in FIGS. 2 and 3, upper cover sheet 21 is slightly shorter than substrate portion 18 at both ends 36 and 38. Lower cover sheet 22 is slightly shorter than substrate portion 18 at end 38.

In FIGS. 1 and 2, at end 36 side of substrate portion 18, the portion from end 36 to dotted line 30 shows first end (hereinafter, end) 40 of a predetermined width. At end 38 side of substrate portion 18, the portion from end 38 to dotted line 32 shows second end (hereinafter, end) 42 of a predetermined width. End 40 corresponds to the top end of the horizontal portion of the T-shaped substrate portion 18, and end 42 corresponds to the bottom end of the vertical portion of the T-shaped substrate portion 18.

In FIGS. 2 and 3, when seen from above, upper cover sheet 21 is formed of connection part 21A (first region) corresponding to the right half of connection part 18A and wiring part 21B of the same width as wiring part 18B. On the other hand, lower cover sheet 22 is formed of connection part 22A (second region) corresponding to the left half of connection part 18A and wiring part 22B of the same width as wiring part 18B. Thus, upper cover sheet 21 and lower cover sheet 22 are L-shaped as shown in FIG. 3.

To make it easy to understand the structure, FIG. 1 does not show the individual shapes of upper and lower cover sheets 21 and 22, but shows how it would look if upper cover sheet 21 was transparent and lower cover sheet 22 could be seen through it. Upper electrodes 25A, 25B and upper electrode terminals 15A, 15B are shown in solid lines. FIG. 2, in which wiring board 50 is seen from above, does not show the part of upper wiring patterns 19A, 19B that is under upper cover sheet 21, and the part of lower wiring patterns 20A, 20B that is under substrate portion 18.

Lower cover sheet 22 is applied to substrate portion 18 in such a manner as to cover the bottom surface of substrate portion 18 except for end 40 of FIG. 2 and first area 181A of the right side of connection part 18A of FIG. 3. Upper cover sheet 21 is applied to substrate portion 18 in such a manner as to cover the top surface of substrate portion 18 except for ends 40 and 42 of FIG. 2 and second area 182A of the left side of connection part 18A of FIG. 3. In connection part 18A, second area 182A corresponds to the area other than first area 181A. Thus, connection part 18A is divided into first area 181A and second area 182A, as the horizontal line of the letter T can be divided into two short horizontal lines.

In other words, the top surface of wiring part 18B is covered with wiring part 21B of upper cover sheet 21 except for end 42, and the bottom surface of wiring part 18B is entirely covered with wiring part 22B of lower cover sheet 22. In connection part 18A, the top surface of upper wiring patterns 19A and 19B is covered with connection part 21A of upper cover sheet 21 except for end 40 of first area 181A, and the bottom surface of lower wiring patterns 20A and 20B is covered with connection part 22A of lower cover sheet 22 except for end 40 of second area 182A.

In first area 181A, upper cover sheet 21 covers at least the top surface of upper wiring patterns 19A and 19B except for end 40, but may cover at least part of first area 181A. In second area 182A, lower cover sheet 22 covers at least the bottom surface of lower wiring patterns 20A and 20B except for end 40, but may cover at least part of second area 182A.

It is possible that connection part 21A of upper cover sheet 21 and connection part 22A of lower cover sheet 22 are partially overlapped with each other with substrate portion 18 interposed therebetween as shown in FIG. 4.

Substrate portion 18 is not covered with lower cover sheet 22 under the area where the top surface has upper wiring patterns 19A and 19B, and not covered with upper cover sheet 21 above the area where the bottom surface has lower wiring patterns 20A and 20B. Thus, almost the entire bottom surface of first area 181A is not covered with lower cover sheet 22, and almost the entire top surface of second area 182A is not covered with lower cover sheet 22. Therefore, the total thickness of connection part 18A, connection part 21A, and connection part 22A is thinner than in the case where substrate portion 18 is covered with the cover sheets except for end 40 of the top and bottom surfaces of substrate portion 18 and for end 42 of the bottom surface of substrate portion 18. As a result, wiring board 50 is more flexible.

It is preferable to provide reinforcement member 27 made of a sheet of polyimide or the like in the area including end 42 and through-hole electrodes 20C, 20D under lower cover sheet 22. By using reinforcement member 27, the strength of wiring board 50 is maintained when wiring board 50 is bent or inserted into the connector.

End 40 of substrate portion 18 is sandwiched between the bottom of upper substrate 1 and the bottom of lower substrate 2. Furthermore, upper wiring patterns 19A and 19B are bonded to upper electrode terminals 15A and 15B, respectively, with an anisotropic conductive adhesive (not shown) or the like. Lower wiring patterns 20A and 20B are bonded to lower electrodes terminals 16A and 16B, respectively. The touch panel has the structure thus described. The anisotropic conductive adhesive is formed by dispersing gold-plated conductive particles of nickel, resin, or the like to a synthetic resin such as epoxy, acrylic, or polyester.

The touch panel thus structured is fixed on the front surface of a display element such as liquid crystal using the adhesive or the like, and then installed in an electronic device. At this moment, wiring board 50 is bent in order to be connected to the electronic circuit of the electronic device. Furthermore, upper wiring patterns 19A, 19B and lower wiring patterns 20A, 20B on the end 38 side are electrically connected to the electronic circuit by a connection connector, soldering, or other means.

At this moment, wiring board 50 is bent, and stress is applied to connection part 18A of the large width. However, as mentioned above, the top and bottom surfaces of connection part 18A are not entirely covered with upper and lower cover sheets 21 and 22. More specifically, as described above, the top surface of upper wiring patterns 19A and 19B of the right half of connection part 18A is covered with connection part 21A except for end 40, and the bottom surface of lower wiring patterns 20A and 20B of the left half of connection part 18A is covered with connection part 22A. Accordingly, the total thickness of connection part 18A, connection part 21A, and connection part 22A is small enough so that they can be bent easily.

Thus, wiring board 50 is easier to bend than in the case where substrate portion 18 is entirely covered with the cover sheets except for the top and bottom surfaces of end 40 and the bottom surface of end 42. This facilitates the connection of wiring board 50 to the electronic circuit at end 42 by the connection connector, soldering, or other means. Furthermore, wiring board 50 can be maintained under a little stress when installed in the electronic device. As a result, it becomes possible to maintain stable electric connection between upper wiring patterns 19A, 19B and upper electrode terminals 15A, 15B or between lower wiring patterns 20A, 20B and lower electrode terminals 16A, 16B.

In the above-described structure, the user touches the top surface of upper substrate 1 with a finger, a touch screen pen, or the like while monitoring the display of the display element disposed behind the touch panel. This touching causes upper substrate 1 to bend and hence upper conductive layer 3 at the touched portion to come into contact with lower conductive layer 4.

On the other hand, the electronic circuit including a controller and a data processor (both not shown), applies a voltage sequentially to upper electrodes 25A, 25B and lower electrodes 26A, 26B via upper wiring patterns 19A, 19B and lower wiring patterns 20A, 20B of wiring board 50. More specifically, the voltage is sequentially applied to the left and right ends of upper conductive layer 3 and to the top and bottom ends of lower conductive layer 4 which are orthogonal to the left and right ends of upper conductive layer 3. When upper substrate 1 is pressed and then upper conductive layer 3 at the pressed portion comes into contact with lower conductive layer 4, a voltage change at the pressed portion is detected. Then, the electronic circuit including the controller and the data processor detects the pressed portion based on the voltage ratio of voltages changed before and after pressing. In this manner, the touch panel and the electronic circuit can switch between the various functions of the electric device.

As described hereinbefore, according to the present embodiment, when the touch panel is seen from the front, a pair of upper electrode terminals 15A, 15B to be respectively connected to upper electrodes 25A, 25B, and lower electrode terminals 16A, 16B to be respectively connected to lower electrodes 26A, 26B are aligned in line. Furthermore, upper electrode terminals 15A and 15B are adjacent to each other, and lower electrode terminals 16A and 16B are adjacent to each other. These electrode terminals are connected to the ends of upper wiring patterns 19A, 19B and the ends of lower wiring patterns 20A, 20B, respectively. L-shaped upper cover sheet 21 covers at least part of the top surface of upper wiring patterns 19A and 19B. L-shaped lower cover sheet 22 covers at least part of the bottom surface of lower wiring patterns 20A and 20B. This reduces the entire thickness of wiring board 50, thereby facilitating its bending. As a result, the touch panel can be easy to handle and ensure reliable operation due to stable electric connection.

The touch panel of the present invention, which is thus easy to handle and ensures reliable operation due to stable electric connection, is useful for operating various electronic devices.

What is claimed is:

1. A touch panel comprising:
    an upper substrate having:
        on a bottom surface thereof,
            an upper conductive layer;
            a pair of upper electrodes; and
            upper electrode terminals, the pair of upper electrodes extending on left and right ends of the upper conductive layer, and upper electrode terminals being each connected to each of the pair of upper electrodes;
    a lower substrate having:
        on a top surface thereof,
            an lower conductive layer;
            a pair of lower electrodes; and
            lower electrode terminals, the lower conductive layer being confronted with the upper conductive layer with a predetermined spacing, the pair of lower electrodes extending on top and bottom ends of the lower conductive layer in a direction orthogonal to the pair of upper electrodes, and the lower electrode terminals being each connected to each of the pair of lower electrodes; and a wiring board including:
    a substrate portion having:
        a pair of upper wiring patterns on its top surface; and
        a pair of lower wiring patterns on its bottom surface, the upper wiring patterns being each connected to each of the upper electrode terminals, and the lower wiring patterns being each connected to each of the lower electrode terminals,
    an L-shaped upper cover sheet for covering the top surface of the substrate portion; and
    an L-shaped lower cover sheet for covering the bottom surface of the substrate portion, wherein the upper electrode terminals are disposed on a bottom of the upper substrate, the lower electrode terminals are disposed on a bottom of the lower substrate, the bottom of the lower substrate being confronted with the bottom of the upper substrate, when the upper substrate is seen from the front, the upper electrode terminals are adjacent to each other, the lower electrode terminals are adjacent to each other, and the upper electrode terminals and the lower electrode terminals are aligned in line, at least part of a top surface of the upper wiring patterns is covered with the upper cover sheet, and at least part of a bottom surface of the lower wiring patterns is covered with the lower cover sheet.

2. The touch panel according to claim 1, wherein the wiring board is shaped like a letter "T" and formed of a connection part and a wiring part, the connection part corresponding to a horizontal line of the letter "T", and the wiring part corresponding to a vertical line of the letter "T" and including an area other than the connection part, the wiring part has the upper wiring patterns and the lower wiring patterns, the connection part includes a first area, a second area, and a first end, the first area and the second area corresponding to two short horizontal lines formed by dividing the horizontal line by the vertical line of the letter "T", and the first end having a predetermined width corresponding to a top end of the horizontal line of the letter "T";

in the first area, the upper wiring patterns are each connected to each of the upper electrode terminals, in the second area, the lower wiring patterns are each connected to each of the lower electrode terminals, in a top surface of the connection part, the upper cover sheet covers an area including the upper wiring patterns except for the first end and does not cover an area corresponding to an area including the lower wiring patterns, in a bottom surface of the connection part, the lower cover sheet covers an area including the lower wiring patterns except for the first end and does not cover an area corresponding to the area including the upper wiring patterns, the wiring part includes a second end having a predetermined width corresponding to a bottom end of the vertical line of the letter "T", and the upper cover sheet and the lower cover sheet cover at least part of the wiring part, and at least one of the upper cover sheet and the lower cover sheet does not cover the second end.

3. The touch panel according to claim 2, wherein in the top surface of the connection part, the upper cover sheet includes a first region not covering the top surface of an area having the lower wiring patterns and covering the first area except for the first end, and in the bottom surface of the connection part, the lower cover sheet includes a second region not covering the bottom surface of an area having the upper wiring patterns and covering the second area except for the first end.

4. The touch panel according to claim 2, further comprising:
    through-hole electrodes for leading the lower wiring patterns from the bottom surface to the top surface of the substrate portion in the wiring part.

5. The touch panel according to claim 4, wherein
    an area of the wiring part except for the second end is covered with the upper cover sheet.

6. The touch panel according to claim 4, further comprising:
    a reinforcement member for covering a bottom surface of the lower cover sheet at least in an area having the through-hole electrodes and the second end of the wiring part.

* * * * *